(12) United States Patent
     Date

(10) Patent No.: US 12,027,208 B2
(45) Date of Patent: Jul. 2, 2024

(54) VOLTAGE CONTROL IN SEMICONDUCTOR MEMORY DEVICE

(71) Applicant: KIOXIA CORPORATION, Tokyo (JP)

(72) Inventor: Hiroki Date, Chigasaki Kanagawa (JP)

(73) Assignee: Kioxia Corporation, Tokyo (JP)

( * ) Notice: Subject to any disclaimer, the term of this patent is extended or adjusted under 35 U.S.C. 154(b) by 178 days.

(21) Appl. No.: 17/680,143

(22) Filed: Feb. 24, 2022

(65) Prior Publication Data

US 2023/0088312 A1    Mar. 23, 2023

(30) Foreign Application Priority Data

Sep. 17, 2021   (JP) ................................. 2021-151710

(51) Int. Cl.
    *G11C 16/04*    (2006.01)
    *G11C 16/08*    (2006.01)
    *G11C 16/26*    (2006.01)

(52) U.S. Cl.
    CPC .......... *G11C 16/08* (2013.01); *G11C 16/0483* (2013.01); *G11C 16/26* (2013.01)

(58) Field of Classification Search
    CPC ..... G11C 16/08; G11C 16/0483; G11C 16/26; G11C 16/30; G11C 16/32
    USPC .................................................... 365/185.17
    See application file for complete search history.

(56) References Cited

U.S. PATENT DOCUMENTS

| | | | |
|---|---|---|---|
| 10,790,266 B2 | 9/2020 | Ito et al. | |
| 2008/0130363 A1* | 6/2008 | Hosono | G11C 16/3418 |
| | | | 365/185.33 |
| 2017/0076800 A1 | 3/2017 | Musha | |
| 2019/0333549 A1 | 10/2019 | Okabe | |

FOREIGN PATENT DOCUMENTS

JP         5418112 B2    2/2014

* cited by examiner

*Primary Examiner* — Tha-O H Bui
(74) *Attorney, Agent, or Firm* — Kim & Stewart LLP

(57) ABSTRACT

A semiconductor memory device includes a memory cell array, a decoder circuit, a voltage supply circuit, and a control circuit. The voltage supply circuit is configured to generate a first voltage supplied to the decoder circuit, a second voltage supplied to a select gate line, and a third voltage supplied to a word line. The control circuit, during a read operation with respect to a memory cell transistor, starts a first control operation on the voltage supply circuit to boost the first voltage to a first target voltage, during the first control operation, starts a second control operation to boost the second voltage, and during the second control operation, starts a third control operation to boost the third voltage. During the first control operation, the first voltage is increased to and maintained at an intermediate voltage lower than the first target voltage for a certain period of time.

20 Claims, 14 Drawing Sheets

VOLTAGE CONTROL IN SEMICONDUCTOR MEMORY DEVICE

CROSS-REFERENCE TO RELATED APPLICATION(S)

This application is based upon and claims the benefit of priority from Japanese Patent Application No. 2021-151710, filed Sep. 17, 2021, the entire contents of which are incorporated herein by reference.

FIELD

Embodiments described herein relate generally to a semiconductor memory device.

BACKGROUND

A semiconductor memory device such as a NAND-type flash memory may require a voltage higher than a power supply voltage supplied from an external power source, for operations of writing, erasing, and reading data. To generate the required voltage, the semiconductor memory device includes a voltage generation circuit that boosts the power supply voltage.

DETAILED DESCRIPTION

Figure 1:
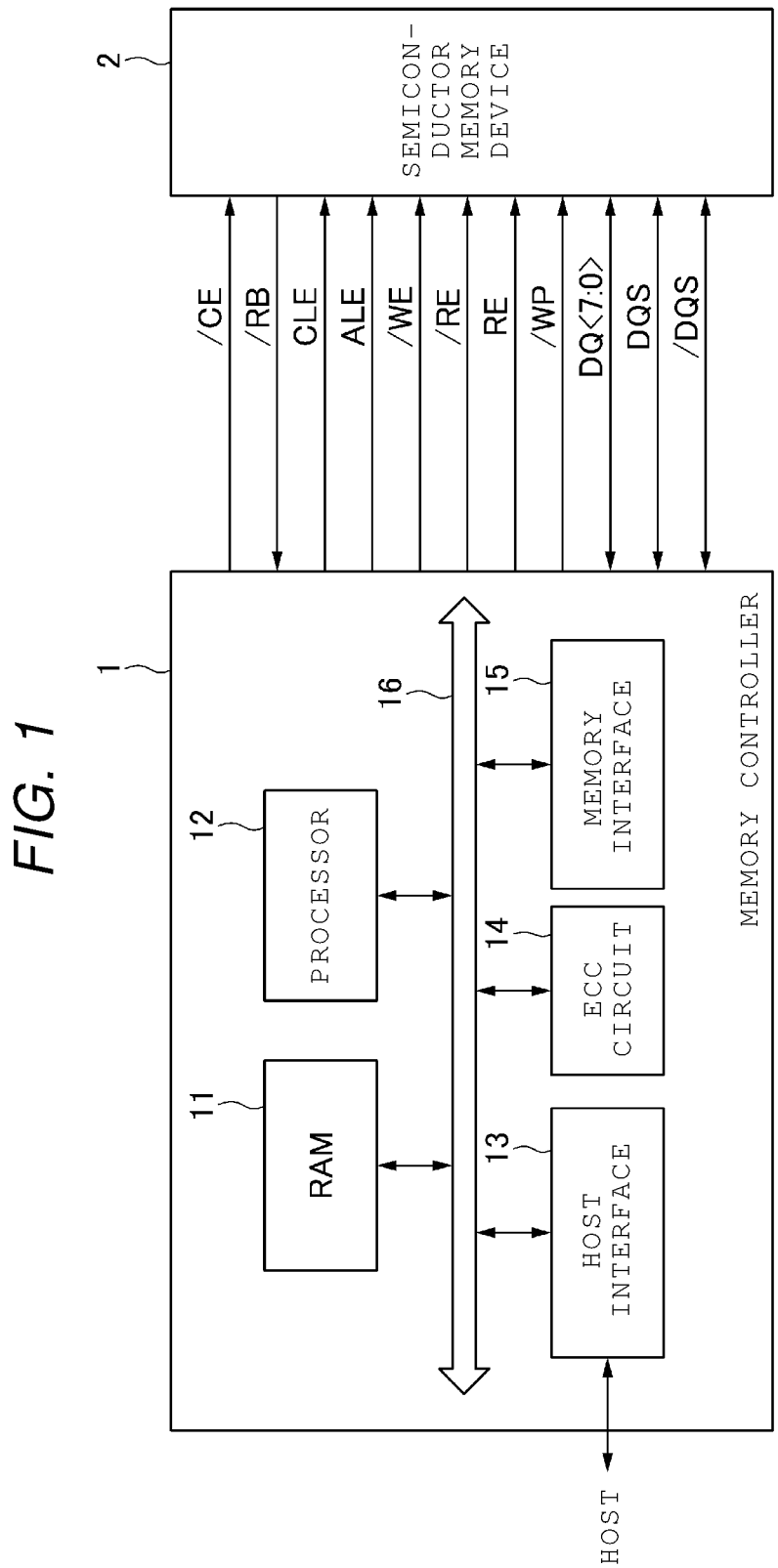
FIG. 1 is a block diagram illustrating a schematic configuration of a memory device according to a first embodiment.

Embodiments provide a semiconductor memory device capable of reducing a peak current.

In general, according to an embodiment, a semiconductor memory device includes a memory cell array, a decoder circuit, a voltage supply circuit, and a control circuit. The memory cell array includes a select transistor and a memory cell transistor connected in series, a bit line connected to the select transistor, a select gate line connected to a gate of the select transistor, and a word line connected to a gate of the memory cell transistor. The decoder circuit is configured to switch between connection and disconnection states of each of the select gate line and the word line. The voltage supply circuit is configured to generate a first voltage supplied to the decoder circuit, a second voltage supplied to the select gate line, and a third voltage supplied to the word line. The control circuit is configured to control the voltage supply circuit. The control circuit, during a read operation with respect to the memory cell transistor, starts a first control operation on the voltage supply circuit to boost the first voltage to a first target voltage to cause the decoder circuit to connect the select gate line to the voltage supply circuit and to connect the word line to the voltage supply circuit, during the first control operation, starts a second control operation on the voltage supply circuit to boost the second voltage to a second target voltage, and during the second control operation, starts a third control operation on the voltage supply circuit to boost the third voltage to a third target voltage. During the first control operation, the first voltage is increased to and maintained at an intermediate voltage lower than the first target voltage for a certain period of time.

Hereinafter, embodiments are described with reference to the drawings. For easier understanding of the description, the same components are denoted by the same reference numerals in each drawing, and the duplicate description is omitted.

First Embodiment (Configuration of Memory Device)

As illustrated in FIG. 1, a memory device according to the present embodiment includes a memory controller 1 and a semiconductor memory device 2. The semiconductor memory device 2 is a nonvolatile memory device that is configured as a NAND-type flash memory. The memory device can be connected to a host. The host is, for example, an electronic device such as a personal computer or a mobile terminal. In FIG. 1, only one semiconductor memory device 2 is illustrated, but a plurality of semiconductor memory devices 2 are provided in the actual memory device.

The memory controller 1 controls writing of data to the semiconductor memory device 2 according to a write request from the host. In addition, the memory controller 1 controls reading of data from the semiconductor memory device 2 according to a read request from the host.

Each signal of a chip enable signal /CE, a ready/busy signal /RB, a command latch enable signal CLE, an address latch enable signal ALE, a write enable signal /WE, read enable signals RE and /RE, a write protect signal /WP, a data signal DQ<7:0>, and data strobe signals DQS and /DQS is transmitted and received between the memory controller 1 and the semiconductor memory device 2.

The chip enable signal /CE is a signal for enabling the semiconductor memory device 2. The ready/busy signal /RB is a signal indicating that the semiconductor memory device 2 is in a ready state or a busy state. The "ready state" is a state in which an instruction from an outside can be received. The "busy state" is a state in which the instruction from the outside cannot be received. The command latch enable signal CLE is a signal indicating that the signal DQ<7:0> is a command. The address latch enable signal ALE is a signal indicating that the signal DQ<7:0> is an address. The write enable signal /WE is a signal for taking in the received signal into the semiconductor memory device 2 and is asserted whenever a command, an address, or data are received by the memory controller 1. The memory controller 1 instructs the semiconductor memory device 2 to take in the signal DQ<7:0> while the signal /WE is in a "low (L)" level.

The read enable signals RE and /RE are signals for the memory controller 1 to read data from the semiconductor memory device 2. The read enable signals RE and /RE are used for controlling an operation timing of the semiconductor memory device 2, for example, when the signal DQ<7:0> is output. The write protect signal /WP is a signal for instructing the semiconductor memory device 2 to prohibit writing and erasing data. The signal DQ<7:0> is data that is transmitted and received between the semiconductor memory device 2 and the memory controller 1 and can include a command, an address, and data. The data strobe signals DQS and /DQS are signals for controlling a timing for inputting and outputting the signal DQ<7:0>.

The memory controller 1 includes a RAM 11, a processor 12, a host interface 13, an ECC circuit 14, and a memory interface 15. These elements included in the memory controller 1 are connected to each other via an internal bus 16.

The host interface 13 outputs a request, user data (write data), and the like received from the host to the internal bus 16. In addition, the host interface 13 transmits user data read from the semiconductor memory device 2, a response from the processor 12, and the like to the host.

The memory interface 15 controls a process of writing user data and the like to the semiconductor memory device 2 and a process of reading user data and the like from the semiconductor memory device 2 based on an instruction of the processor 12.

The processor 12 comprehensively controls the memory controller 1. The processor 12 is a CPU, an MPU, or the like. When a request is received from the host via the host interface 13, the processor 12 performs control according to the request. For example, the processor 12 instructs the memory interface 15 to write user data and parity to the semiconductor memory device 2 according to the request from the host. In addition, the processor 12 instructs the memory interface 15 to read user data and parity from the semiconductor memory device 2 according to the request from the host.

The processor 12 determines a storage area (memory area) of the semiconductor memory device 2 for user data accumulated in the RAM 11 via the internal bus 16. The user data is temporarily stored in the RAM 11. The processor 12 determines the memory area with respect to data (page data) in a page unit that is a write unit. In the following, the user data stored in one page of the semiconductor memory device 2 is referred to as "unit data". The unit data is generally encoded and stored in the semiconductor memory device 2 as a codeword. In the present embodiment, the encoding is not necessary. The memory controller 1 may store the unit data in the semiconductor memory device 2 without encoding. In FIG. 1, a configuration of performing encoding is illustrated as an example. When the memory controller 1 does not encode, the page data is the unit data. One codeword may be generated based on one unit data, and one codeword may be generated based on divided data of the unit data. In addition, one codeword may be generated by using a plurality of pieces of unit data.

The processor 12 determines the storage area of the semiconductor memory device 2 as a writing destination per unit data. A physical address is assigned to the storage area of the semiconductor memory device 2. The processor 12 manages the storage area of the writing destination of the unit data by using the physical address. The processor 12 designates the determined storage area (physical address) and instructs the memory interface 15 to write the user data to the semiconductor memory device 2. The processor 12 manages a correspondence between a logical address (a logical address managed by the host) and the physical address of the user data. When a read request including a logical address from the host is received, the processor 12 specifies a physical address corresponding to the logical address, designates the physical address, and also instructs the memory interface 15 to read the user data therefrom.

The ECC circuit 14 encodes the user data stored in the RAM 11 and generates the codeword. The ECC circuit 14 decodes the codeword read from the semiconductor memory device 2.

The RAM 11 temporarily stores the user data received from the host until the data is stored in the semiconductor memory device 2 or temporarily stores the data read from the semiconductor memory device 2 until the data is transmitted to the host. The RAM 11 is a general-purpose memory such as an SRAM or a DRAM.

FIG. 1 illustrates a configuration example in which the memory controller 1 includes the ECC circuit 14 and the memory interface 15. Alternatively, the ECC circuit 14 may be built in the memory interface 15. The ECC circuit 14 may be built in the semiconductor memory device 2. The specific configuration and arrangement of each component illustrated in FIG. 1 are not particularly limited.

When the write request is received from the host, the memory device of FIG. 1 operates as follows. The processor 12 temporarily stores the data to be written in the RAM 11. The processor 12 reads the data stored in the RAM 11 and inputs the data to the ECC circuit 14. The ECC circuit 14 encodes the input data and inputs the codeword to the memory interface 15. The memory interface 15 writes the input codeword to the semiconductor memory device 2.

When the read request is received from the host, the memory device of FIG. 1 operates as follows. The memory interface 15 inputs the codeword read from the semiconductor memory device 2 to the ECC circuit 14. The ECC circuit 14 decodes the input codeword and stores the decoded data in the RAM 11. The processor 12 transmits the data stored in the RAM 11 to the host via the host interface 13.

(Schematic Configuration of Semiconductor Memory Device)

Figure 2:
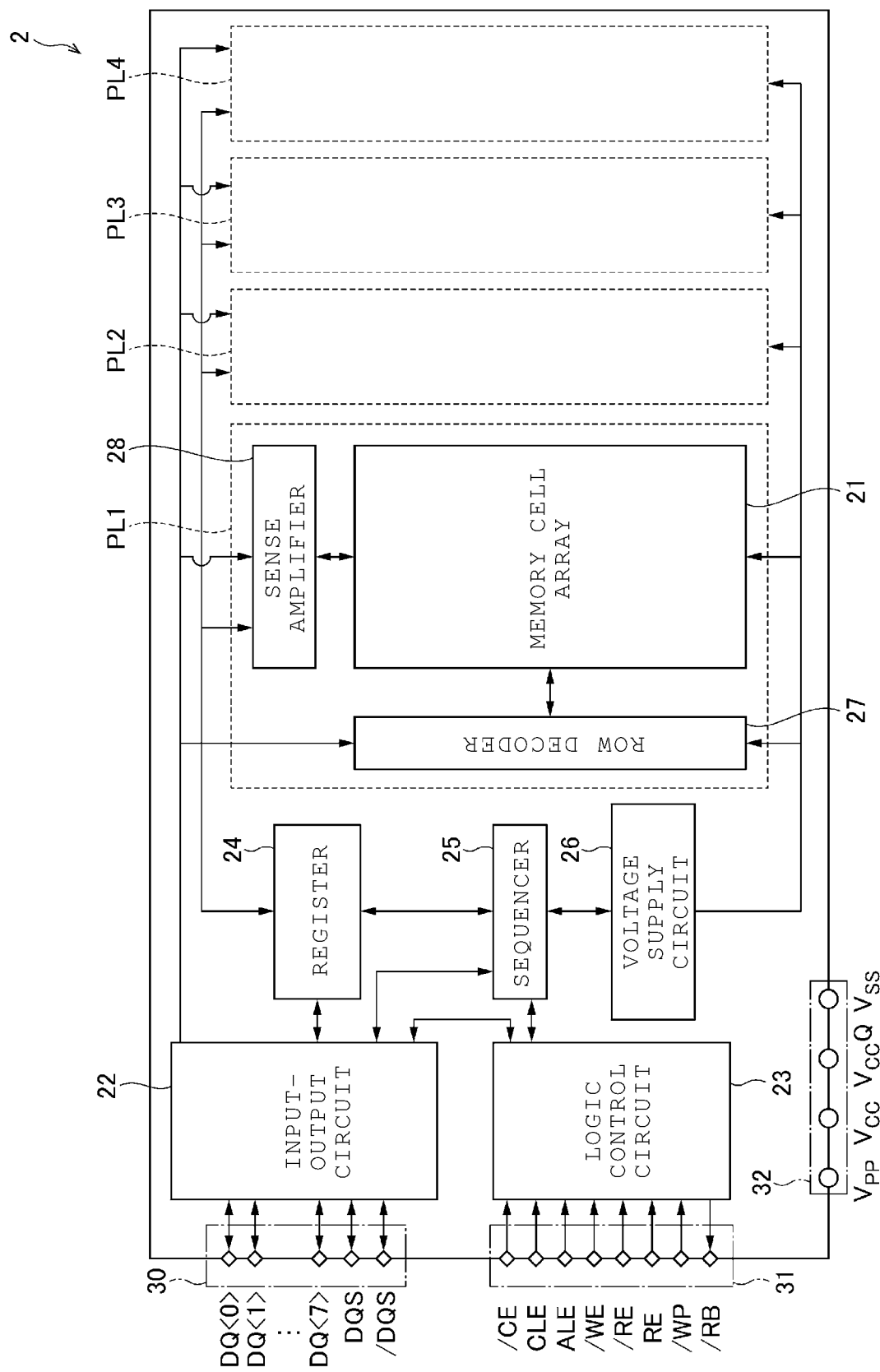
FIG. 2 is a block diagram illustrating a schematic configuration of a semiconductor memory device according to the first embodiment.

As illustrated in FIG. 2, the semiconductor memory device 2 includes four planes PL1 to PL4, an input-output circuit 22, a logic control circuit 23, a register 24, a sequencer 25, a voltage supply circuit 26, an input-output pad group 30, a logic control pad group 31, and a power supply input terminal group 32.

The plane PL1 includes a memory cell array 21, a row decoder 27, and a sense amplifier 28. The planes PL2 to PL4 have the same configuration as the plane PL1 and thus are not illustrated in FIG. 2. In addition, the number of planes provided in the semiconductor memory device 2 is not limited to four, and may be changed to any applicable number.

The memory cell array 21 is an element that stores data. The memory cell array 21 includes a plurality of memory cell transistors associated with a plurality of bit lines and a plurality of word lines.

The input-output circuit 22 transmits and receives the signal DQ<7:0> and the data strobe signals DQS and /DQS to and from the memory controller 1. The input-output circuit 22 transmits a command and an address in the signal DQ<7:0> to the register 24. Further, the input-output circuit 22 transmits and receives write data and read data to and from the sense amplifier 28.

The logic control circuit 23 receives the chip enable signal /CE, the command latch enable signal CLE, the address latch enable signal ALE, the write enable signal /WE, the read enable signals RE and /RE, and the write protect signal /WP from the memory controller 1. The logic control circuit 23 transmits the ready/busy signal /RB to the memory controller 1 to notify the state of the semiconductor memory device 2 to the outside.

The register 24 temporarily stores various kinds of data. The register 24 stores a command, for example, for instructing a write operation, a read operation, an erasing operation, and the like. This command is input from the memory controller 1 to the input-output circuit 22, transmitted from the input-output circuit 22 to the register 24, and stored in the register 24. The register 24 also stores an address corresponding to the command. This address is input from the memory controller 1 to the input-output circuit 22, transmitted from the input-output circuit 22 to the register 24, and stored in the register 24. Further, the register 24 also stores status information indicating an operation state of the semiconductor memory device 2. The status information is updated by the sequencer 25 according to the operation states of the planes PL1 to PL4 and the like. The status information is output from the input-output circuit 22 to the memory controller 1 as a state signal according to a request from the memory controller 1.

The sequencer 25 controls an operation of units including the planes PL1 to PL4 based on control signals input from the memory controller 1 to the input-output circuit 22 and the logic control circuit 23.

The voltage supply circuit 26 is a circuit that generates voltages necessary for the write operation, the read operation, and the erasing operation of data in the memory cell array 21 of each of the planes PL1 to PL4. The voltages include, for example, voltages applied respectively to the plurality of word lines and the plurality of bit lines of the memory cell array 21. The operation of the voltage supply circuit 26 is controlled by the sequencer 25.

The row decoder 27 is a circuit including a group of switch elements for applying the voltages respectively to the plurality of word lines of the memory cell array 21. The row decoder 27 receives a block address and a row address from the register 24 to select a block based on the block address and also select a word line based on the row address. The row decoder 27 switches open (e.g., disconnection) and closed (e.g., connection) states of the switch group so that the voltage from the voltage supply circuit 26 is applied to the selected word line. The operation of the row decoder 27 is controlled by the sequencer 25.

The sense amplifier 28 is a circuit that adjusts a voltage applied to the bit line of the memory cell array 21 and reads a voltage of the bit line to convert the voltage into data. When reading the data, the sense amplifier 28 acquires data read from the memory cell transistor of the memory cell array 21 to the bit line and transmits the acquired read data to the input-output circuit 22. When writing data, the sense amplifier 28 transmits the written data to the memory cell transistor via the bit line. The operation of the sense amplifier 28 is controlled by the sequencer 25.

The input-output pad group 30 is an element in which a plurality of terminals (pads) transmit and receive signals between the memory controller 1 and the input-output circuit 22. The terminals are independently provided corresponding to the signal DQ<7:0>, and the data strobe signals DQS and /DQS, respectively.

The logic control pad group 31 is an element in which a plurality of terminals transmit and receive signals between the memory controller 1 and the logic control circuit 23. The terminals are independently provided corresponding to the chip enable signal /CE, the command latch enable signal CLE, the address latch enable signal ALE, the write enable signal /WE, the read enable signals RE and /RE, the write protect signal /WP, and the ready/busy signal /RB, respectively.

The power supply input terminal group 32 is an element in which a plurality of terminals receive voltages necessary for the operation of the semiconductor memory device 2. The voltages applied to the respective terminals include power supply voltages Vcc, VccQ, and Vpp, and a ground voltage Vss. The power supply voltage Vcc is a circuit power supply voltage applied from the outside as the operation power supply, and is, for example, a voltage of about 3.3 V. The power supply voltage VccQ is, for example, a voltage of 1.2 V. The power supply voltage VccQ is a voltage used when signals are transmitted and received between the memory controller 1 and the semiconductor memory device 2. The power supply voltage Vpp is a power supply voltage higher than the power supply voltage Vcc, and is, for example, a voltage of 12 V.

(Configuration of Plane)

Subsequently, configurations of the planes PL1 to PL4 are described. As described above, the planes PL1 to PL4 have the same configuration, and thus the configuration of the plane PL1 is representatively described in the following.

Figure 3:
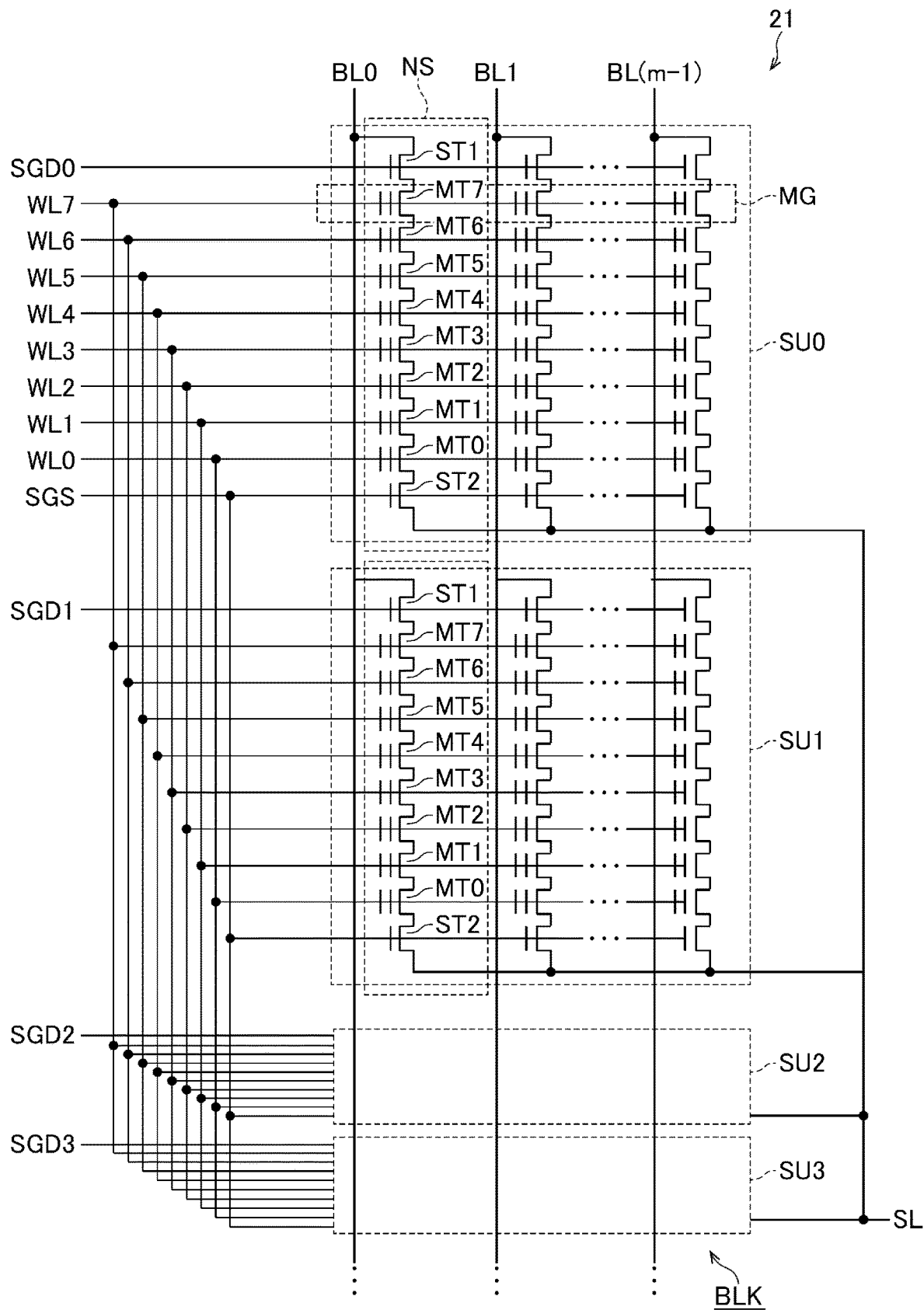
FIG. 3 is a circuit diagram illustrating a configuration of a memory cell array in the semiconductor memory device according to the first embodiment.

As illustrated in FIG. 3, the memory cell array 21 includes a plurality of blocks BLK. In FIG. 3, only one of the plurality of blocks BLK is illustrated. The configurations of the other blocks BLK in the memory cell array 21 are also the same as that illustrated in FIG. 3.

As illustrated in FIG. 3, the block BLK includes, for example, four string units SU (SU0 to SU3). Each of the string units SU includes a plurality of NAND strings NS. Each of the NAND strings NS includes, for example, eight memory cell transistors MT (MT0 to MT7) and select transistors ST1 and ST2.

The number of memory cell transistors MT is not limited to eight, and may be, for example, 32, 48, 64, or 96. For example, in order to improve a cutoff characteristic, each of the select transistors ST1 and ST2 may include a plurality of transistors instead of a single transistor. Further, a dummy transistor may be provided between the memory cell transistors MT and the select transistors ST1 and ST2.

The memory cell transistors MT are connected in series between the select transistor ST1 and the select transistor ST2. The memory cell transistor MT7 on one end side is connected to the source of the select transistor ST1, and the memory cell transistor MT0 on the other end side is connected to the drain of the select transistor ST2.

The gates of the select transistors ST1 of the string units SU0 to SU3 are commonly connected to select gate lines SGD0 to SGD3, respectively. The gates of the select transistors ST2 are commonly connected to the same select gate line SGS between the plurality of string units SU in the same block BLK. The gates of the memory cell transistors MT0 to MT7 in the same block BLK are commonly connected to word lines WL0 to WL7, respectively. That is, while the word lines WL0 to WL7 and the select gate line SGS are common among the plurality of string units SU0 to SU3 in the same block BLK, the select gate line SGD is independently provided for each of the string units SU0 to SU3 in the same block BLK.

m bit lines BL (BL0, BL1, . . . , and BL(m−1)) are provided in the memory cell array 21. "m" is an integer indicating the number of NAND strings NS in one string unit SU. The drains of the select transistors ST1 of the NAND strings NS are connected to the corresponding bit lines BL, respectively. The sources of the select transistors ST2 of the NAND strings NS are connected to a source line SL. The source line SL is common to the sources of the plurality of select transistors ST2 in the block BLK.

Data stored in the plurality of memory cell transistors MT in the same block BLK are collectively erased. In contrast, the reading and writing of data are collectively performed on the plurality of memory cell transistors MT that are connected to one word line WL and belong to one string unit SU.

In the following description, a set of 1-bit data stored by the plurality of memory cell transistors MT that are connected to one word line WL and belong to one string unit SU is referred to as a "page". In FIG. 3, a reference numeral "MG" is used to one of the sets configured with the plurality of memory cell transistors MT corresponding to one page as above.

(Cross-Sectional Structure of Semiconductor Memory Device)

Figure 4:
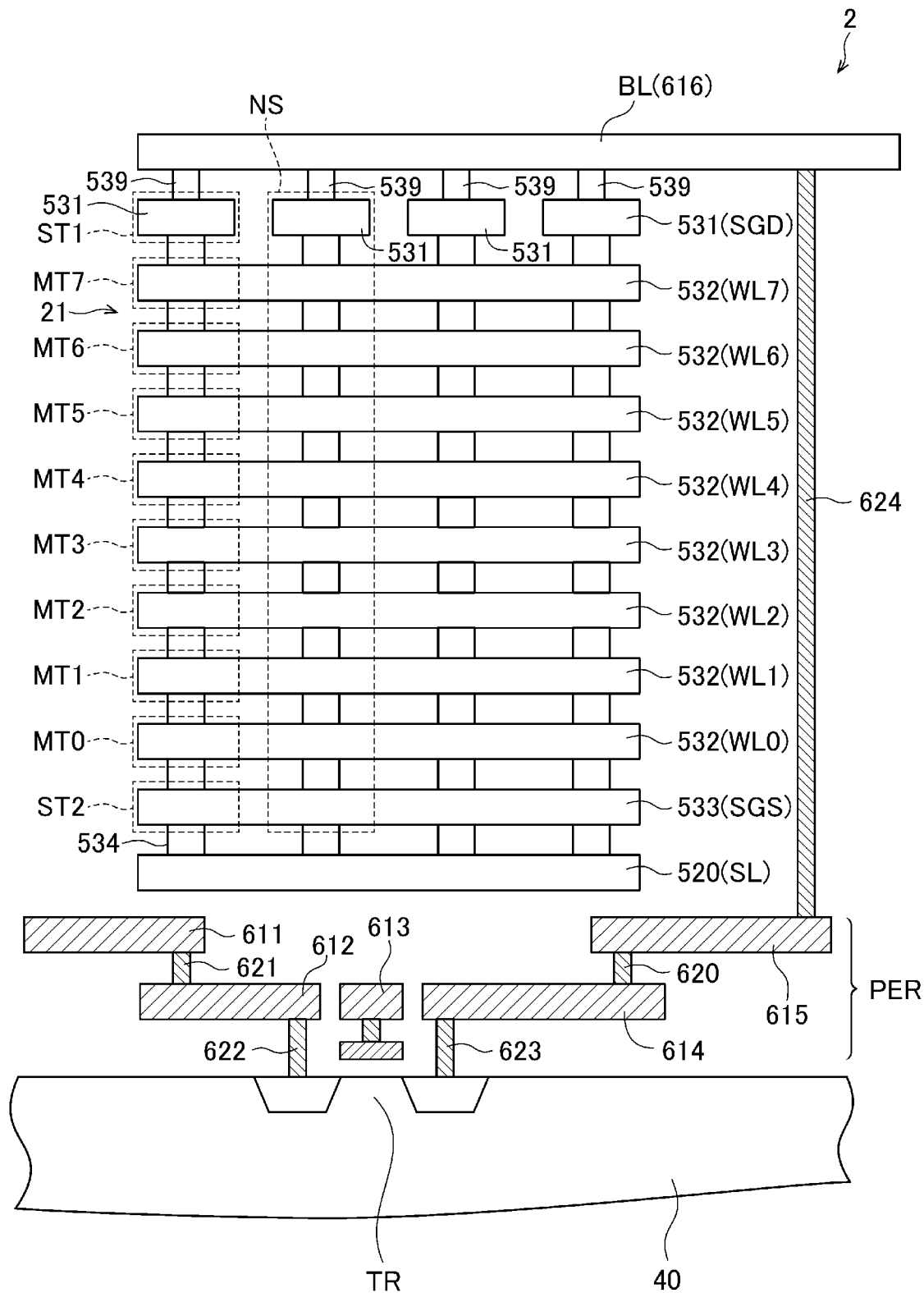
FIG. 4 is a cross-sectional diagram illustrating a cross-sectional structure of the semiconductor memory device according to the first embodiment.

As illustrated in FIG. 4, the semiconductor memory device 2 has a structure in which a peripheral circuit PER and the memory cell array 21 are located on a semiconductor substrate 40.

In the memory cell array 21, a plurality of NAND strings NS are formed on a conductor layer 520. The conductor layer 520 is referred to as an embedded source line (BSL), and corresponds to the source line SL of FIG. 3.

A wiring layer 533 that functions as the select gate line SGS, a plurality of wiring layers 532 that function as the word line WL, and a wiring layer 531 that functions as the select gate line SGD are stacked above the conductor layer 520. Insulating layers (not illustrated) are located respectively between the stacked wiring layers 533, 532, and 531.

A plurality of memory holes 534 are formed on the memory cell array 21. The memory holes 534 penetrate the wiring layer 533, 532, and 531, and the insulating layers (not illustrated) provided therebetween in the vertical direction and reach the conductor layer 520.

Among the memory holes 534, portions that respectively intersect the stacked wiring layers 533, 532, and 531 function as transistors. Among the plurality of transistors, the transistors in portions intersecting the wiring layer 531 function as the select transistor ST1. Among the plurality of transistors, the transistors in portions intersecting the wiring layers 532 function as the memory cell transistors MT (MT0 to MT7). Among the plurality of transistors, the transistors in portions intersecting the wiring layer 533 function as the select transistor ST2.

A wiring layer 616 that functions as the bit line BL is formed above the memory holes 534. The upper ends of the memory holes 534 are connected to the wiring layer 616 via contact plugs 539.

A plurality of structures that are the same as the structure illustrated in FIG. 4 are located along a depth direction of the paper surface of FIG. 4. One string unit SU is formed by a set of the plurality of NAND strings NS located in a row along the depth direction of the paper surface of FIG. 4.

The semiconductor substrate 40 and the conductor layer 520 (the source line SL) are spaced apart from each other, and a part of the peripheral circuit PER is disposed therebetween. The peripheral circuit PER is a circuit that implements a write operation, a read operation, an erasing operation, and the like with respect to data in the memory cell array 21. The sense amplifier 28, the row decoder 27, the voltage supply circuit 26, and the like illustrated in FIG. 2 are parts of the peripheral circuit PER.

The peripheral circuit PER includes a transistor TR that is formed on the semiconductor substrate 40 and a plurality of conductors 611 to 615. For example, the conductors 611 to 615 are wiring layers that are formed of conductors such as metal. The conductors 611 to 615 are disposed at a plurality of height positions, and are electrically connected to each other via contacts 620 to 623. The contacts 620 to 623 are formed by forming contact holes to penetrate the insulating layers (not illustrated) in the vertical direction and then filling in the contact holes, for example, with a conductor material such as tungsten. The conductor 615 is electrically connected to the wiring layer 616 (the bit line BL) via a contact 624.

(Configurations of Voltage Generation Circuit and Row Decoder)

Figure 5:
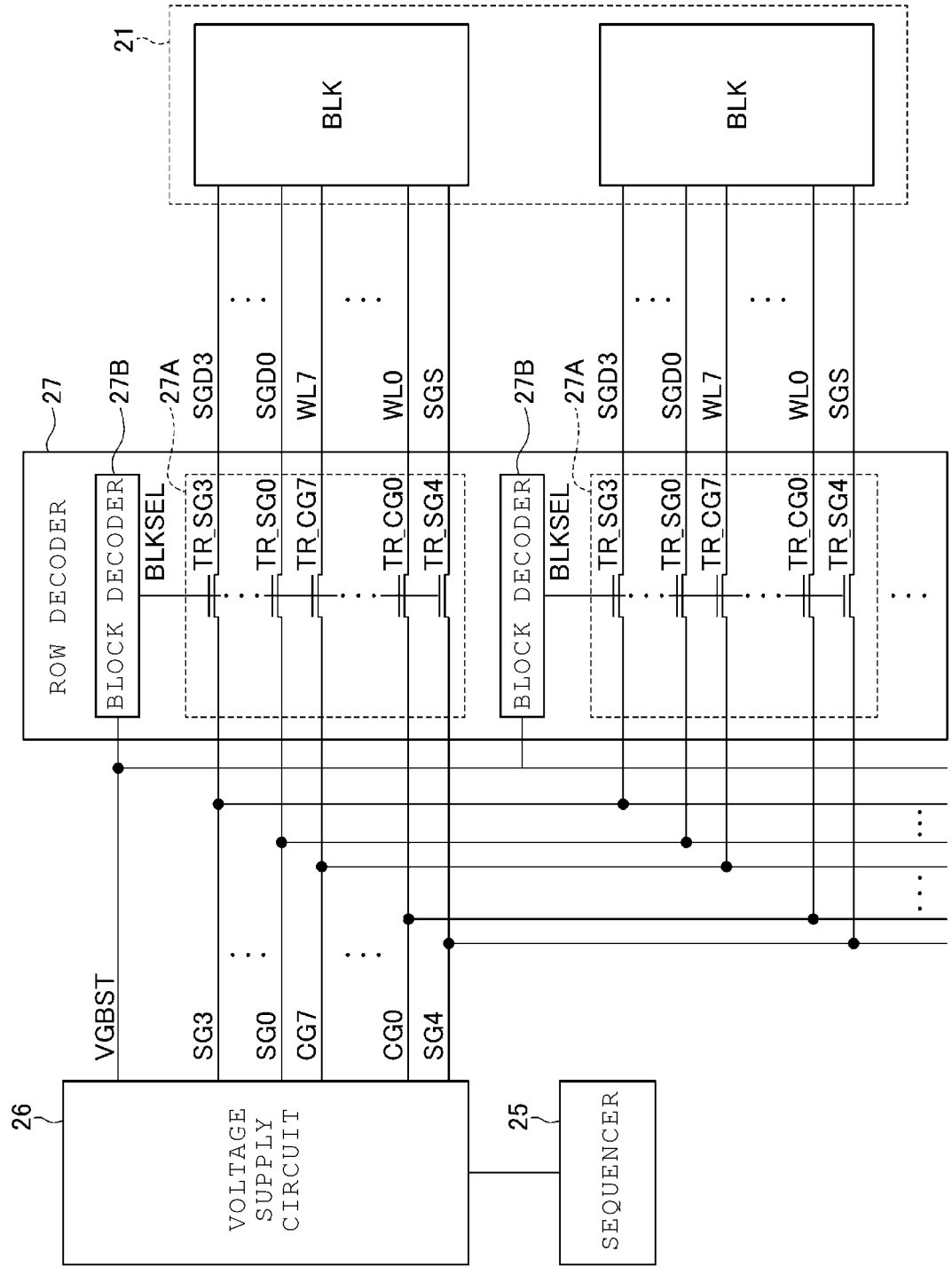
FIG. 5 is a circuit diagram illustrating a configuration of a part of the semiconductor memory device according to the first embodiment.
Figure 6:
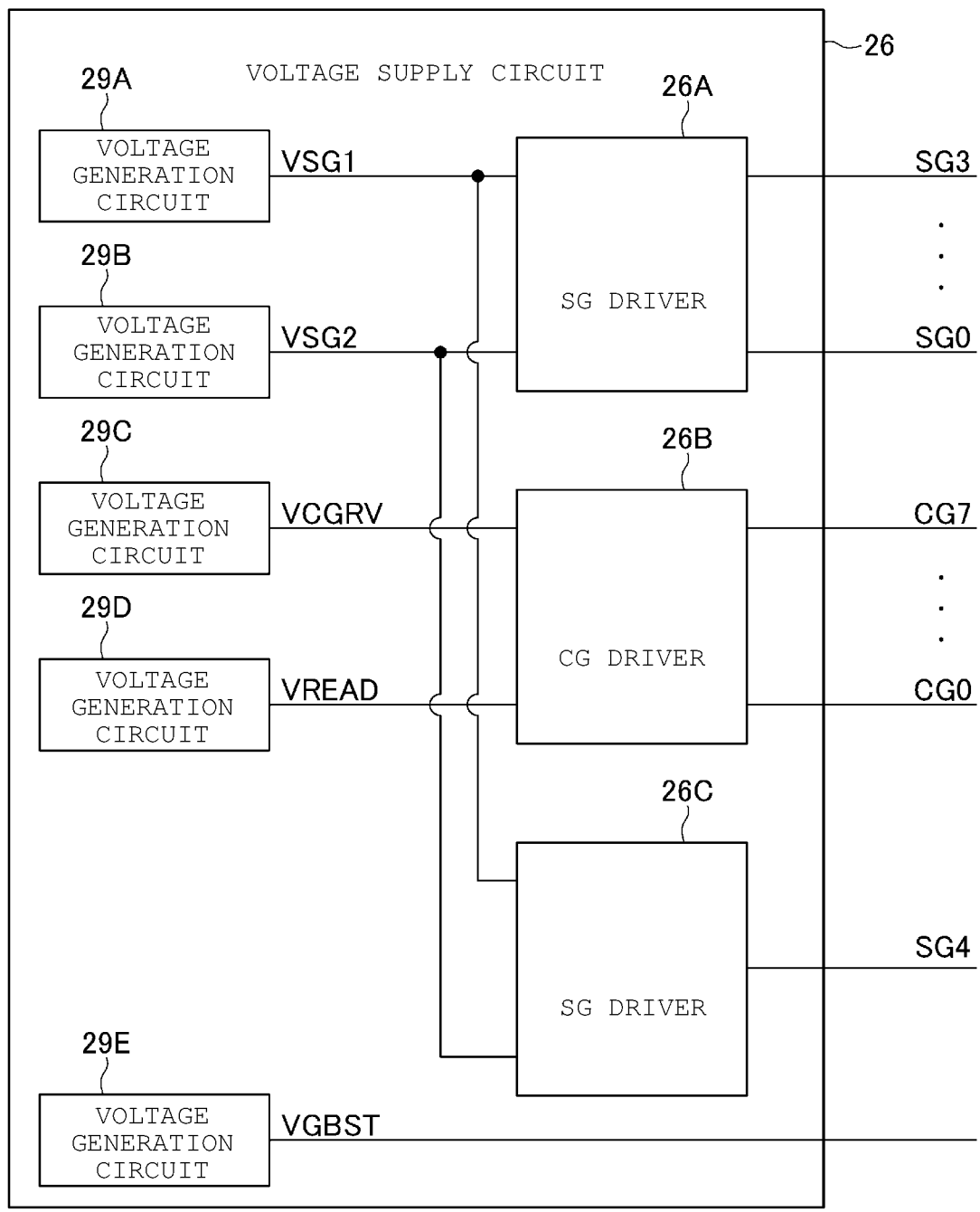
FIG. 6 is a block diagram illustrating a schematic configuration of a voltage supply circuit in the semiconductor memory device according to the first embodiment.

The voltage supply circuit 26 illustrated in FIG. 5 generates various voltages including voltages necessary for the program operation, the read operation, and the like on the memory cell transistors MT. As illustrated in FIG. 6, the voltage supply circuit 26 includes an SG driver (select gate line driver) 26A that supplies the voltages to signal lines SG0 to SG3, a CG driver (word line driver) 26B that supplies the voltages respectively to signal lines CG0 to CG7, and an SG driver (select gate line driver) 26C that supplies the voltage to the signal line SG4. As illustrated in FIG. 5, these signal lines SG0 to SG4, and CG0 to CG7 are branched to the row decoder 27 and are connected to wirings of each of the blocks BLK.

The signal lines SG0 to SG3 function as global drain-side select gate lines, and are connected to the select gate lines SGD0 to SGD3 as local select gate lines for each of the blocks BLK via the row decoder 27.

The signal lines CG0 to CG7 function as global word lines and are connected to the word lines WL0 to WL7 as the local word lines for each of the blocks BLK via the row decoder 27.

The signal line SG4 functions as a global source-side select gate line and is connected to the select gate lines SGS as the local select gate lines for each of the blocks BLK via the row decoder 27.

The row decoder 27 includes a plurality of switch circuit groups 27A that correspond respectively to the blocks and a plurality of block decoders 27B provided corresponding respectively to the plurality of switch circuit groups 27A. Each of the switch circuit groups 27A includes the transistors TR_SG0 to TR_SG4 and the plurality of transistors TR_CG0 to TR_CG7. The plurality of transistors TR_SG0 to TR_SG4 are connected to the signal lines SG0 to SG4 and the select gate lines SGD0 to SGD3, and SGS, respectively. The plurality of transistors TR_CG0 to TR_CG7 are connected to the signal lines CG0 to CG7 and the word lines WL0 to WL7, respectively. The transistors TR_SG0 to TR_SG4 and the transistors TR_CG0 to TR_CG7 are high breakdown voltage transistors. In the present embodiment, the transistors TR_SG0 to TR_SG4 correspond to first transmission transistors, and the transistors TR_CG0 to TR_CG7 correspond to second transmission transistors.

When the block decoder 27B itself is designated by the row address, the block decoder 27B supplies a block selection signal BLKSEL to the gates of the transistors TR_SG0 to TR_SG4 and the transistors TR_CG0 to TR_CG7. Accordingly, in the switch circuit group 27A to which the block selection signal BLKSEL is supplied, the transistors TR_SG0 to TR_SG4 and the transistors TR_CG0 to TR_CG7 enter an on state and are electrically connected. As a result, the voltages that are supplied from the voltage supply circuit 26 to the signal lines SG0 to SG4 and the signal lines CG0 to CG7 are supplied to the select gate lines SGD0 to SGD3, and SGS and the word lines WL0 to WL7 in a target block BLK of an operation.

As illustrated in FIG. 6, the voltage supply circuit 26 further includes voltage generation circuits 29A to 29E.

The voltage generation circuits 29A to 29E generate various voltages necessary for operations of each portion of the semiconductor memory device 2 by using the voltage input from the power supply input terminal group 32. The voltage generation circuit 29A generates a voltage VSG1 supplied to a selected select gate line SGDsel that corresponds to a target string unit SU of an operation. The voltage VSG1 is, for example, a voltage of 10 V. The voltage generation circuit 29B generates a voltage VSG2 supplied to a non-selected select gate line SGDusel that corresponds to a non-target string unit SU of the operation. The voltage VSG2 is, for example, the voltage of 0 V. The voltage generation circuit 29C generates a voltage VCGRV that is supplied to a selected word line WLsel. The voltage generation circuit 29D generates a voltage VREAD that is supplied to a non-selected word line WLusel. The voltage VREAD is, for example, a voltage of 9 V. The voltage generation circuit 29E generates a voltage VGBST that is supplied to the block decoder 27B. The voltage VGBST is, for example, a voltage of 14 V.

The voltages generated by the voltage generation circuit 29A and the voltage generation circuit 29B are input to the SG drivers 26A and 26C. The voltages generated by the voltage generation circuit 29C and the voltage generation circuit 29D are input to the CG driver 26B. The voltage generated by the voltage generation circuit 29E is input to the block decoder 27B in the row decoder 27 via a voltage supply line.

Figure 7:
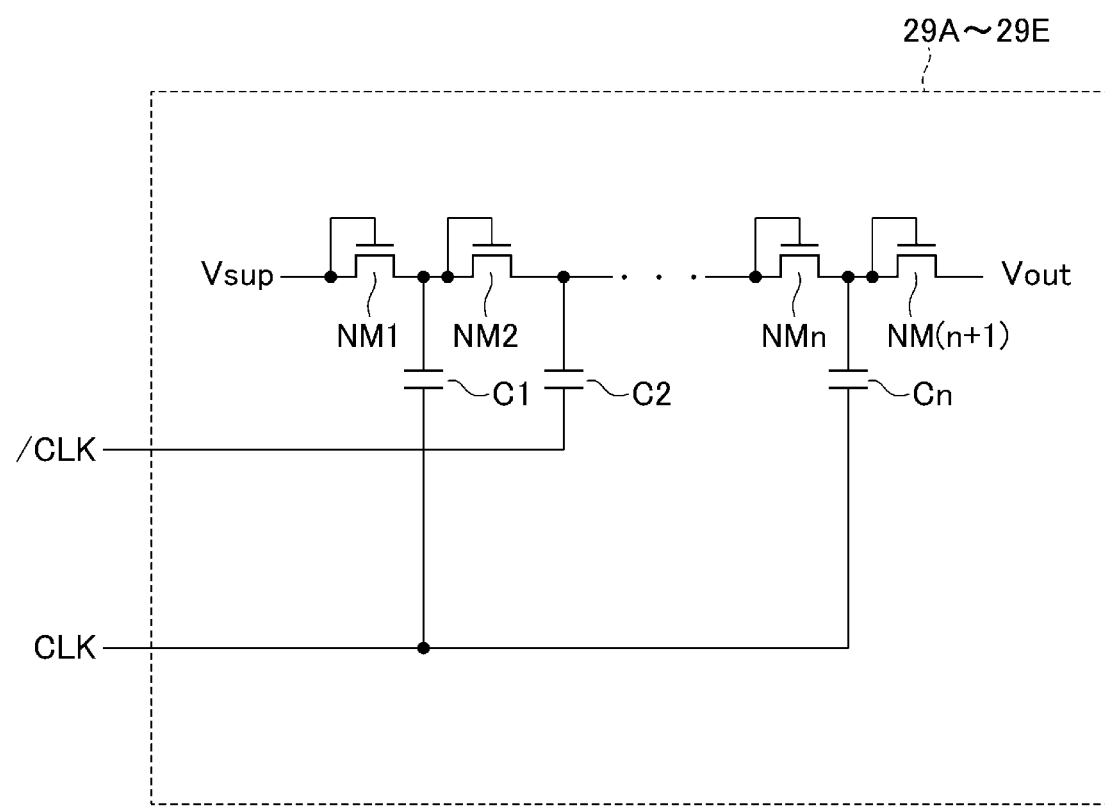
FIG. 7 is a circuit diagram illustrating a configuration of a voltage generation circuit in the voltage supply circuit.

As illustrated in FIG. 7, the voltage generation circuits 29A to 29E include, for example, n+1 NMOS transistors NM1 to NM(n+1) and n capacitors C1 to Cn, respectively. "n" is an integer indicating the number of capacitors. Each of the NMOS transistors NM1 to NM(n+1) is diode-connected and functions as a diode. The current paths of the NMOS transistors NM1 to NM(n+1) are connected to each other in series.

One ends of the capacitors C1 to Cn are electrically connected to one ends of the NMOS transistors NM1 to NMn, respectively. A clock signal CLK is supplied to the other ends of the capacitors C1, C3, . . . , and C(2m−1) that are connected to the NMOS transistor NM(2m−1) located at odd-numbered positions such as the NMOS transistors NM1, NM3, and the like. Here, m=1, 2, and the like. A clock signal /CLK is supplied to the other ends of capacitors C2, C4, . . . , and C(2m) that are connected to the NMOS transistor NM(2m) located at even-numbered positions such as the NMOS transistors NM2, NM4, and the like. A voltage Vsup (for example, the power supply voltage Vcc) is input to the other end of the NMOS transistor NM1. The capacitors C1 to Cn repeat charging and discharging based on the clock signals CLK and /CLK. As a result, an output voltage Vout larger than the voltage Vsup is generated, and the output voltage Vout is transmitted (output) from one end of the NMOS transistor NM(n+1).

Any one of the SG drivers 26A and 26C and the CG driver 26B illustrated in FIG. 6 has a plurality of input ends into which a plurality of kinds of input voltages are input, and a plurality of switches located on respective supply paths of the plurality of kinds of voltages are turned on and off to supply any one of the plurality of kinds of voltages to each signal line.

For example, the SG driver 26A supplies the voltage VSG1 generated by the voltage generation circuit 29A or the voltage VSG2 generated by the voltage generation circuit 29B to the signal line SG0. The same applies to the other signal lines SG1 to SG3.

The CG driver 26B supplies the voltage VCGRV generated by the voltage generation circuit 29C or the voltage VREAD generated by the voltage generation circuit 29D to the signal line CG0. The same applies to the other signal lines CG1 to CG7.

The SG driver 26C supplies the voltage VSG1 generated by the voltage generation circuit 29A or the voltage VSG2 generated by the voltage generation circuit 29B to the signal line SG4.

As illustrated in FIG. 5, operations of these components of the voltage supply circuit 26 are controlled by the sequencer 25. For example, the turning on and off of the switches T1 and T2, timings for driving the voltage generation circuits 29A to 29E, the generation of voltages, and the like are controlled by the sequencer 25.

(Operation Example of Voltage Supply Circuit 26)

An operation example of the voltage supply circuit 26 in the case of reading data is described.

Figure 8:
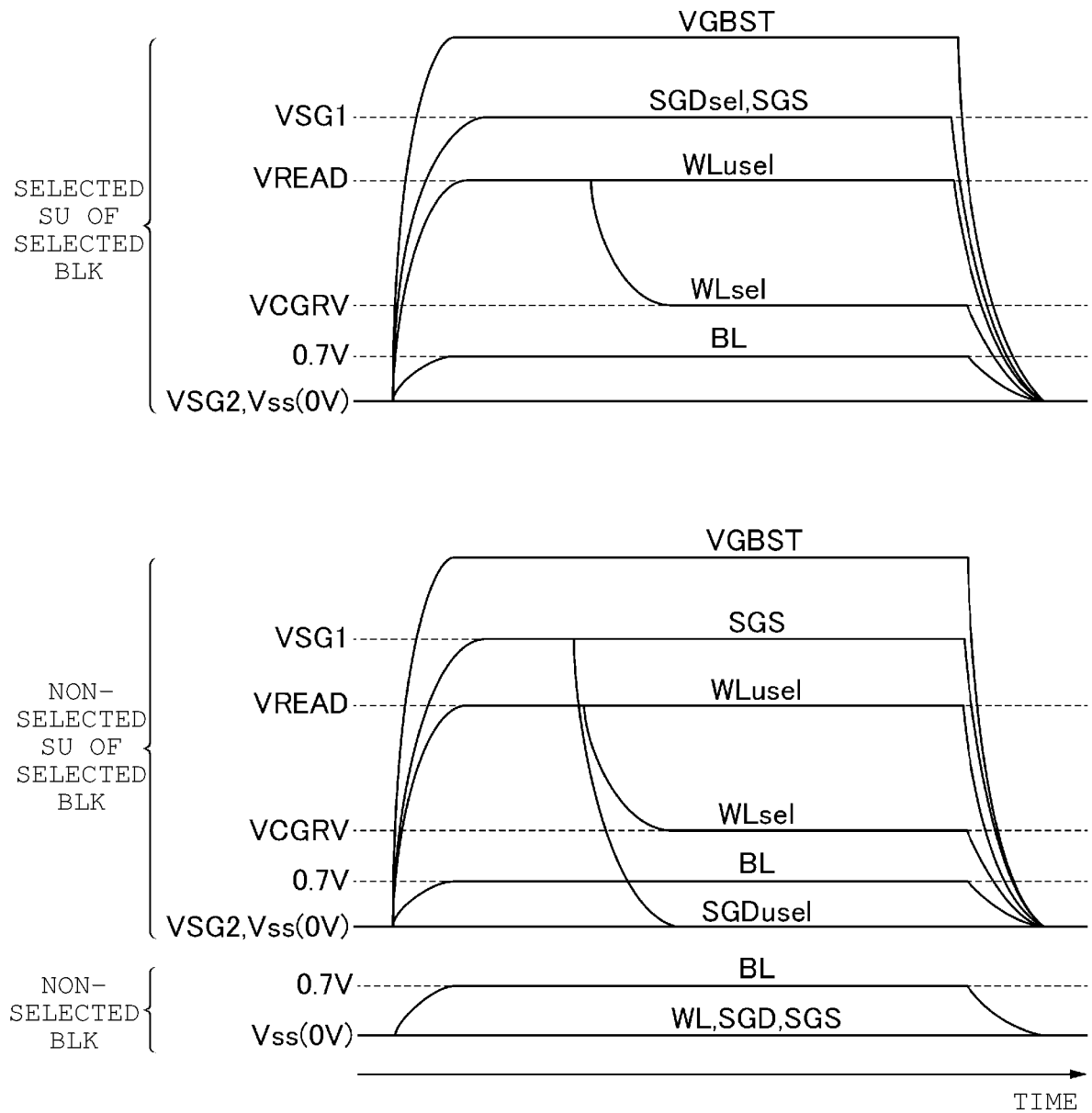
FIG. 8 is a timing chart illustrating a transition of a voltage of each wiring during a read operation in the semiconductor memory device according to the first embodiment.

FIG. 8 illustrates a voltage change of each wiring during a read operation. In the following, a case where the read operation is performed with respect to the plane PL1 is representatively described. In the read operation, the NAND string NS including a target block BLK of the read operation and a target memory cell transistor MT of the read operation is selected. That is, the string unit SU including a target block BLK of the read operation and a target page of the target block BLK is selected.

First, the voltage VGBST is applied from the voltage supply circuit 26 to the block decoder 27B corresponding to the selected block BLK. Accordingly, the block selection signal BLKSEL is supplied from the block decoder 27B to the gates of the transistors TR_SG0 to TR_SG4 and the transistors TR_CG0 to TR_CG7 corresponding to the selected block BLK, so that the transistors TR_SG0 to TR_SG4 and the transistors TR_CG0 to TR_CG7 enter an on state. As a result, the voltages can be supplied from the voltage supply circuit 26 to the select gate lines SGD0 to SGD3, and SGS and the word lines WL0 to WL7 to be operation targets via the signal lines SG0 to SG4 and the signal lines CG0 to CG7. That is, the read operation of the data can be performed on the selected block BLK.

Subsequently, for example, the voltage VSG1 is applied from the voltage supply circuit 26 to the selected select gate line SGDsel, the non-selected select gate line SGDusel, and the select gate line SGS via the row decoder 27. Accordingly, the select transistor ST1 and the select transistor ST2 in the selected block BLK enter an on state.

For example, the read pass voltage VREAD is applied from the voltage supply circuit 26 to a selected word line WLsel and a non-selected word line WLusel via the row decoder 27. Regardless of the threshold voltage of the memory cell transistor MT, the read pass voltage VREAD is a voltage that can cause the memory cell transistor MT to enter an on state and does not change the threshold voltage. Accordingly, regardless of whether the string units SU are the selected string units SU or the non-selected string units SU, all of the NAND strings NS in the selected block BLK are electrically connected.

Subsequently, for example, the read voltage VCGRV is applied from the voltage supply circuit 26 to the word line WL (the selected word line WLsel) connected to the memory cell transistor MT to be the target of the read operation via the row decoder 27. The read pass voltage VREAD is continuously applied to the rest of the word lines WL (the non-selected word lines WLusel).

In addition, while the voltage applied to the selected select gate line SGDsel and the select gate line SGS is maintained, the voltage VSG2 is applied from the voltage supply circuit 26 to the non-selected select gate line SGDusel via the row decoder 27. Accordingly, the select transistor ST1 in the selected string unit SU maintains the on state, but the select transistor ST1 in the non-selected string unit SU enters an off state. Regardless of whether the string unit SU is the selected string unit SU or the non-selected string unit SU, the select transistor ST2 in the selected block BLK enters an on state.

Accordingly, in the NAND string NS in the non-selected string unit SU, at least the select transistor ST1 enters an off state, and thus a current pass is not formed. Meanwhile, in the NAND string NS in the selected string unit SU, a current pass may be formed or a current pass may not be formed according to the relationship between the read voltage VCGRV applied to the selected word line WLsel and the threshold voltage of the memory cell transistor MT.

The sense amplifier 28 illustrated in FIG. 2 applies the voltage to the bit line BL connected to the selected NAND string NS. In this state, the sense amplifier 28 reads data based on the value of the voltage of the corresponding bit line BL. Specifically, it is determined whether the threshold voltage of the memory cell transistor MT to be the target of the read operation is higher than the read voltage applied to the corresponding memory cell transistor MT. The data may be read not based on the value of the voltage of the bit line BL but based on the temporal change of the voltage of the bit line BL. In the latter case, the bit line BL is pre-charged to be at a predetermined voltage in advance.

Figure 9A:
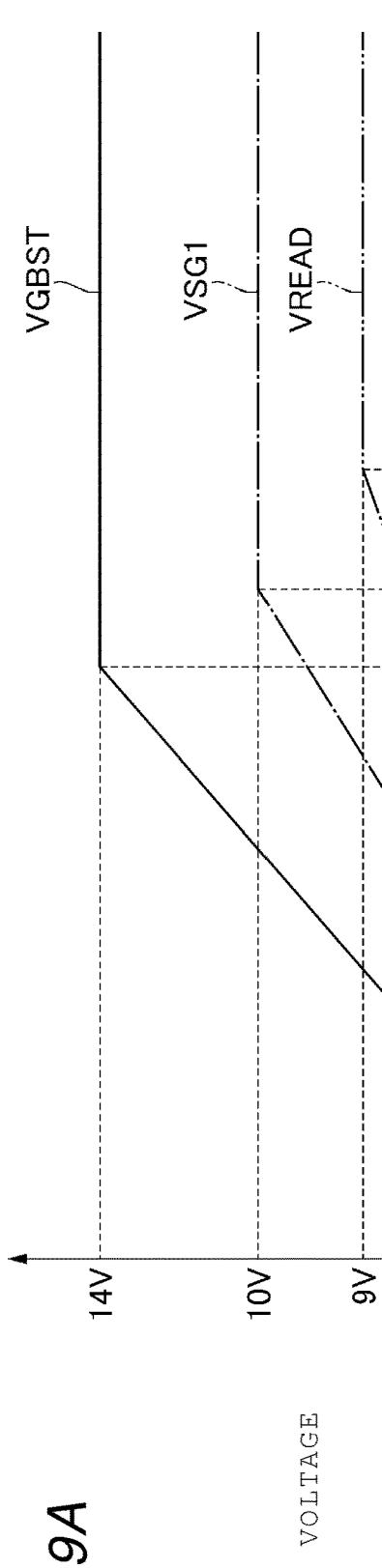
FIGS. 9A and 9B are timing charts illustrating transitions of a voltage and a current of some wirings during a read operation in a semiconductor memory device according to a comparative example.

When the read operation is performed in this manner, at the initial stage, for example, as illustrated in FIG. 9A, the voltage VSG1 generated by the voltage generation circuit 29A, the voltage VREAD generated by the voltage generation circuit 29D, and the voltage VGBST generated by the voltage generation circuit 29E transition. More specifically, the voltages increase in the order of the voltage VGBST, the voltage VSG1, and the voltage VREAD. In this case, a current $I_{VSG1}$ that flows from the voltage generation circuit 29A, a current $I_{VREAD}$ that flows from the voltage generation circuit 29D, and a current $I_{VGBST}$ that flows from the voltage generation circuit 29E transition as illustrated in FIG. 9B.

Figure 9B:
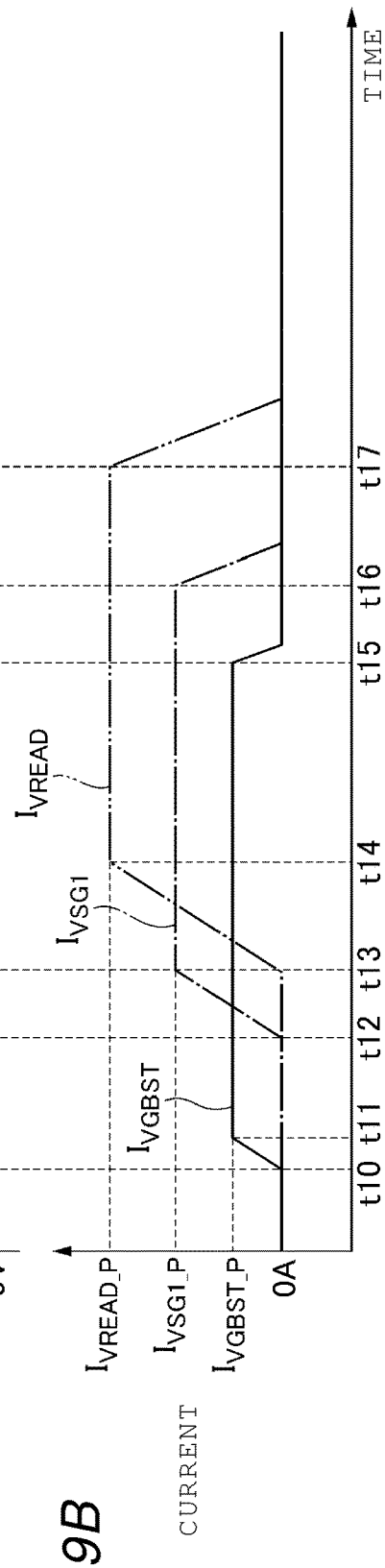

That is, when the voltage VGBST starts to increase at time t10 as illustrated in FIG. 9A, the current $I_{VGBST}$ that flows from the voltage generation circuit 29E starts to increase at time t10 as illustrated in FIG. 9B. Also, when the current $I_{VGBST}$ reaches a peak value $I_{VGBST\_P}$ at time t11, the current $I_{VGBST}$ is maintained at the peak value $I_{VGBST\_P}$ thereafter. Then, when the voltage VGBST reaches the target voltage of 14 V at time t15, the current $I_{VGBST}$ starts to decrease at time t15 and becomes 0 A.

In the same manner, as illustrated in FIGS. 9A and 9B, when the voltage VSG1 starts to increase at time t12, the current $I_{VSG1}$ that flows from the voltage generation circuit 29A also starts to increase at time t12. Also, when the current $I_{VSG1}$ reaches a peak value $I_{VSG1\_P}$ at time t13, the current $I_{VSG1}$ is maintained at the peak value $I_{VSG1\_P}$ thereafter. Then, when the voltage VSG1 reaches the target voltage of 10 V at time t16, the current $I_{VSG1}$ starts to decrease at time t16 and becomes 0 A.

Further, when the voltage VREAD starts to increase at time t13, the current $I_{VREAD}$ that flows from the voltage generation circuit 29D also starts to increase at time t13. Also, when the current $I_{VREAD}$ reaches a peak value $I_{VREAD\_P}$ at time t14, the current $I_{VREAD}$ is maintained at the peak value $I_{VREAD\_P}$ thereafter. Then, when the voltage VREAD reaches the target voltage of 9 V at time t17, the current $I_{VREAD}$ starts to decrease at time t17 and becomes 0 A.

In this manner, the currents $I_{VGBST}$, $I_{VSG1}$ and $I_{VREAD}$ transition as illustrated in FIGS. 9A and 9B. When all the currents are the maximum values, i.e., during the period from time t14 to time t15, a peak value $I_{cc\_P}$ of a current $I_{cc}$ that flows from the voltage supply circuit 26 can be obtained by Expression f1 below. In Expression f1, "α" indicates the other currents that flow from the voltage generation circuits other than the voltage generation circuits 29A to 29E in the voltage supply circuit 26.

$$I_{cc\_P} = I_{VGBST\_P} + I_{VSG1\_P} + I_{VREAD\_P} + \alpha \quad (f1)$$

In order to reduce the peak current $I_{cc\_P}$, the sequencer 25 of the present embodiment controls the voltage supply circuit 26 to increase the voltage VGBST stepwise, so that the period of time when the current $I_{VGBST}$ becomes the peak is shifted in time from the period of time when the currents $I_{VGBST}$ and $I_{VREAD}$ become the peak.

(Operation Example of Sequencer)

Subsequently, a method for controlling the voltage supply circuit 26 executed by the sequencer 25 according to the present embodiment is described.

Figure 10:
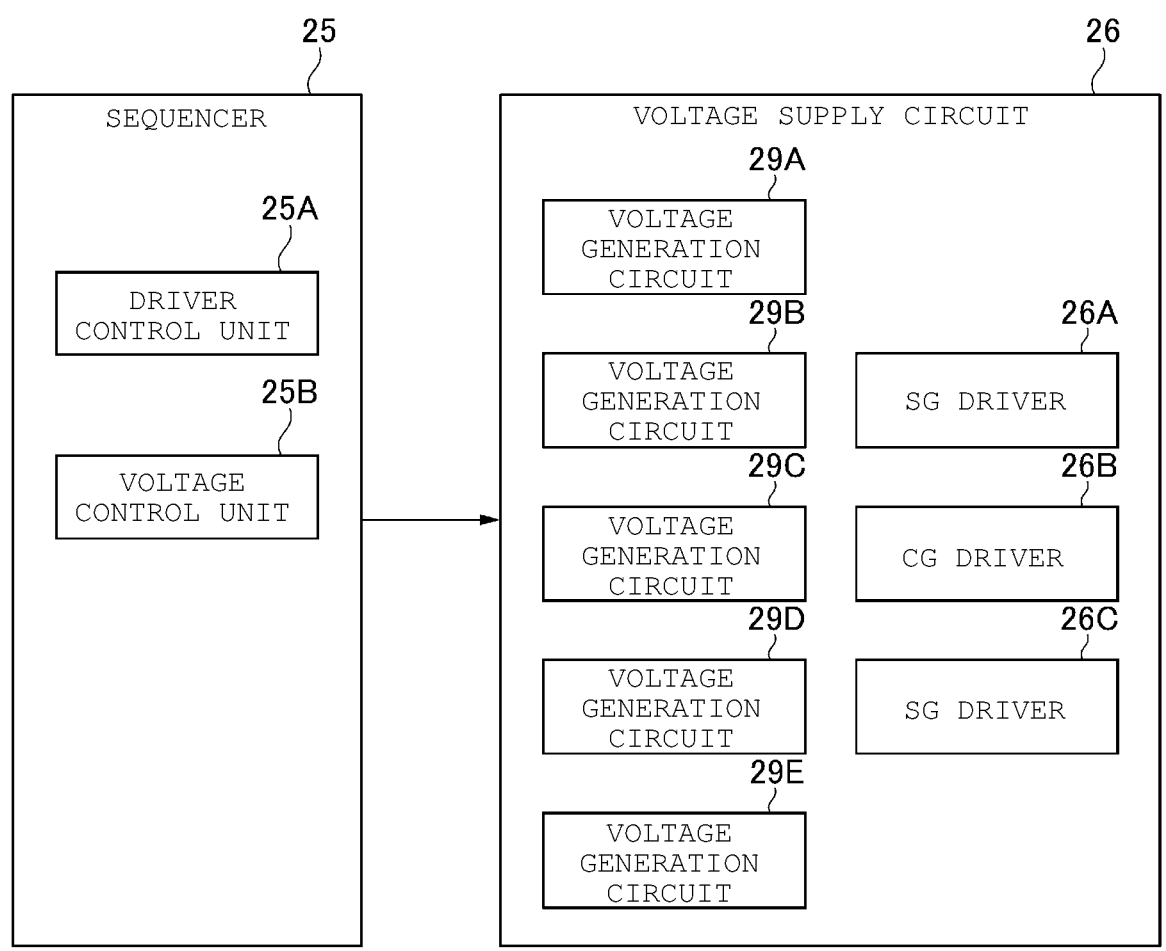
FIG. 10 is a block diagram illustrating configurations of a sequencer and a voltage supply circuit according to the first embodiment.

As illustrated in FIG. 10, the sequencer 25 includes a driver control unit (e.g., a driver control circuit) 25A and a voltage control unit (e.g., a voltage control circuit) 25B as a functional configuration thereof. The driver control unit 25A controls each of the drivers 26A to 26C of the voltage supply circuit 26, to control the voltages supplied from the drivers 26A to 26C to the signal lines SG0 to SG3, CG0 to CG7, and SG4. The voltage control unit 25B generates the voltages VSG1, VSG2, VCGRV, VREAD, and VGBST by controlling each of the voltage generation circuits 29A to 29E of the voltage supply circuit 26. According to the present embodiment, the sequencer 25 corresponds to the control circuit.

In order to read data, the voltage control unit 25B starts first boost control of increasing the voltage VGBST to 14 V on the voltage generation circuit 29E. Then, during the first boost control, the voltage control unit 25B starts second boost control of increasing the voltage VSG1 to 10 V on the voltage generation circuit 29A. Further, during the second boost control, the voltage control unit 25B starts third boost control of increasing the voltage VREAD to 9 V on the voltage generation circuit 29D.

In the present embodiment, the voltage generation circuit 29E corresponds to the first voltage generation circuit, and the voltage VGBST corresponds to the first voltage, and 14 V that is the target voltage of the voltage VGBST corresponds to the first target voltage. In addition, the voltage generation circuit 29A corresponds to the second voltage generation circuit, the voltage VSG1 corresponds to the second voltage, and 10 V that is the target voltage of the voltage VSG1 corresponds to the second target voltage. Further, the voltage generation circuit 29D corresponds to the third voltage generation circuit, the voltage VREAD corresponds to the third voltage, and 9 V that is the target voltage of the voltage VREAD corresponds to the third target voltage.

Figure 11:
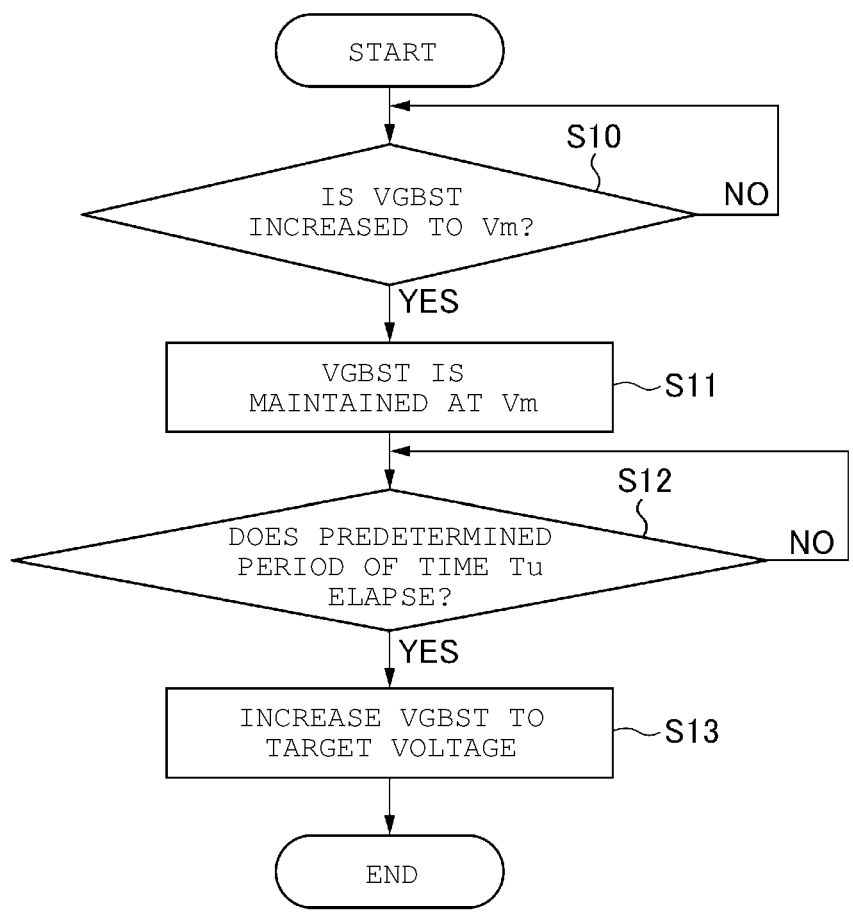
FIG. 11 is a flowchart illustrating a procedure of a process performed by the sequencer according to the first embodiment.

The voltage control unit 25B performs the first boost control according to the procedure illustrated in FIG. 11. As illustrated in FIG. 11, when the first boost control is started, first, the voltage control unit 25B determines whether the voltage VGBST reached an intermediate voltage Vm (Step S10). The intermediate voltage Vm is set in the range of "0 V<Vm<14 V". Specifically, in the circumstance in which the voltage VSG1 does not reach 10 V, and the voltage VREAD does not reach 9 V, the intermediate voltage Vm is set to the voltage value that can output the block selection signal BLKSEL that can turn on the transistors TR_SG0 to TR_SG4 and the transistors TR_CG0 to TR_CG7 from the block decoder 27B. The process of Step S10 may be performed, for example, by the voltage generation circuit 29E.

When it is determined that the voltage VGBST reached the intermediate voltage Vm (Step S10: YES), the voltage control unit 25B controls the voltage generation circuit 29E so that the voltage VGBST is maintained at the intermediate voltage Vm for a predetermined period of time Ta (Step S11). Then, it is determined whether the predetermined period of time Ta elapsed after the voltage VGBST is started to be maintained at the intermediate voltage Vm (Step S12). When the predetermined period of time Ta elapsed (Step S12: YES), the voltage control unit 25B further increases the voltage VGBST from the intermediate voltage Vm to the target voltage of 14 V (Step S13).

(Operation Example of Semiconductor Memory Device)

Subsequently, the operation example of the semiconductor memory device 2 according to the present embodiment is described with reference to FIGS. 12A and 12B.

Figures 12A, 12B:
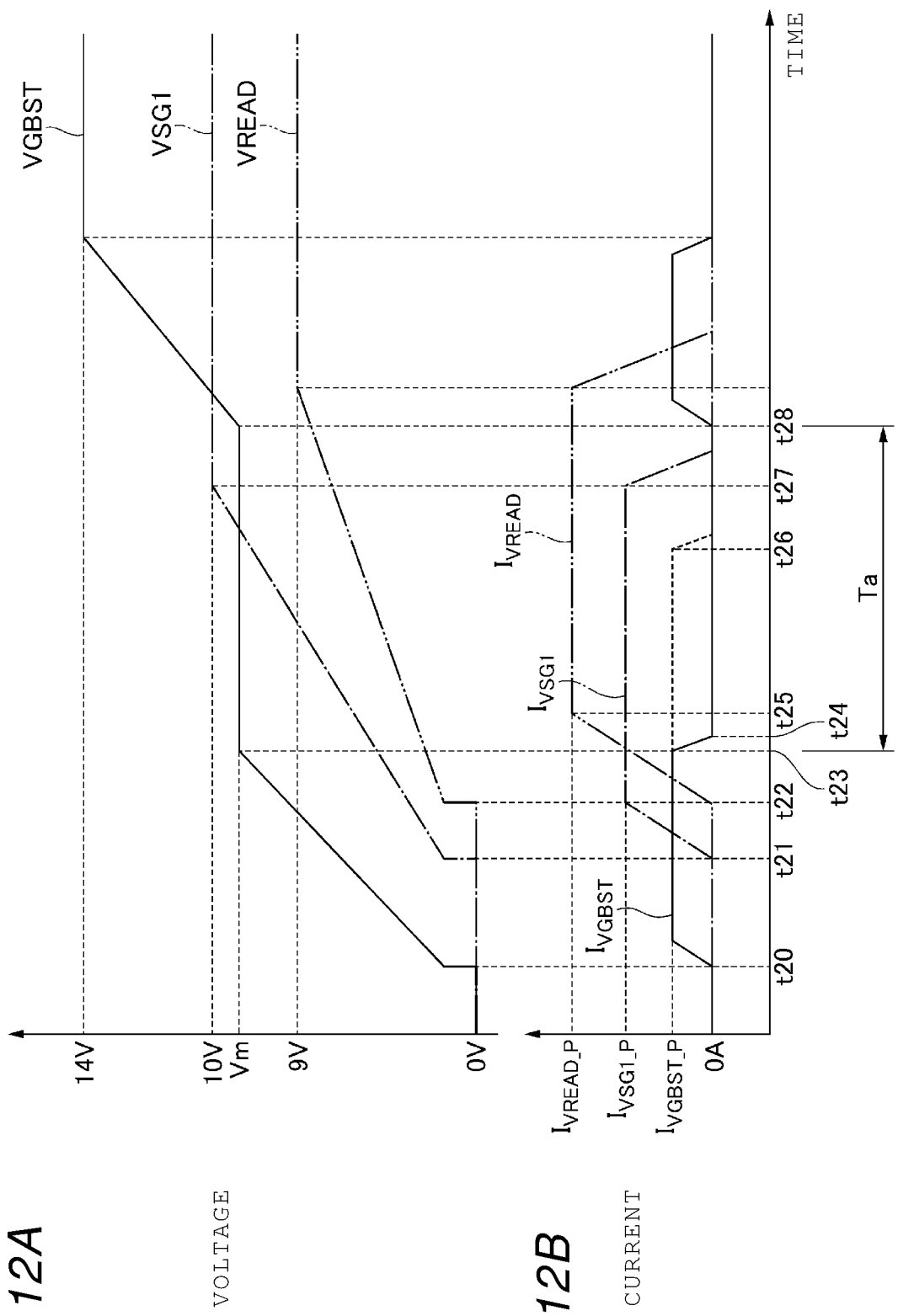
FIGS. 12A and 12B are timing charts illustrating transitions of a voltage and a current of some wirings during a read operation in the semiconductor memory device according to the first embodiment.

As illustrated in FIG. 12A, in the semiconductor memory device 2 according to the present embodiment, when the first boost control starts at time t20, the voltage VGBST starts to increase. Then, when the second boost control starts at time t21 during the first boost control, the voltage VSG1 starts to increase. Further, when the third boost control starts at time t22 during the first boost control and the second boost control, the voltage VREAD starts to increase. When the voltage VGBST increases to the intermediate voltage Vm at time t23, the voltage VGBST is maintained at the intermediate voltage Vm during the period from time t23 to time t28 when the predetermined period of time Ta elapses. In addition, the voltage VGBST further increases to the target voltage of 14 V after the time t28.

At this point, as illustrated in FIG. 12B, the current $I_{VGBST}$ decreases at time t23 and becomes 0 A at time t24. Accordingly, when the current $I_{VREAD}$ reaches the peak value $I_{VREAD\_P}$ at time t25, the current $I_{VGBST}$ becomes 0 A. Therefore, during the period from time t25 to time t27 when the current $I_{VSG1}$ starts to decrease, the peak current $I_{cc\_P}$ satisfies Expression f2 below.

$$I_{cc\_P}=I_{VSG1\_P}+I_{VREAD\_P}+\alpha \quad (f2)$$

In FIG. 12B, the transition of the current $I_{VGBST}$ illustrated in FIG. 9B is illustrated with a broken line. As illustrated with the broken line in FIG. 12B, when the current $I_{VGBST}$ transitions, during the period from time t25 to time t26, the peak current $I_{cc\_P}$ becomes the value obtained by Expression f1 above. In contrast, in the semiconductor memory device 2 according to the present embodiment, during the period from time t25 to time t26, the peak current $I_{cc\_P}$ becomes the value obtained by Expression f2 above. That is, the peak current $I_{cc\_P}$ is reduced by the amount of the current $I_{VGBST}$.

(Effect)

As described above, during the read operation of data, after the first boost control of increasing the voltage VGBST to 14 V is started, the sequencer 25 starts the second boost control of increasing the voltage VSG1 to 10 V during the first boost control. In addition, during the second boost control, the sequencer 25 starts the third boost control of increasing the voltage VREAD to 9 V. In the first boost control, during the period until the predetermined period of time Ta elapses from time t23 before time t25 when the current $I_{VREAD}$ reaches the peak value $I_{VREAD\_P}$, the sequencer 25 maintains the voltage VGBST at the intermediate voltage Vm, and then increases the voltage VGBST to 14 V. According to this configuration, the peak current $I_{cc\_P}$ can be reduced by the peak value $I_{VSGBST\_P}$ of the current $I_{VGBST}$.

In addition, in the first boost control, after the voltage VSG1 reaches 10 V, the sequencer 25 increases the voltage VGBST from the intermediate voltage Vm to 14 V. According to this configuration, after the current $I_{VSG1}$ starts to decrease from the peak value $I_{VREAD\_P}$ or after the current $I_{VSG1}$ decreases to 0 A, the current $I_{VGBST}$ increases. Therefore, it is possible to reduce the peak current $I_{cc\_P}$.

Second Embodiment

Subsequently, a semiconductor memory device 2 according to a second embodiment is described. Hereinafter, the difference from the semiconductor memory device 2 according to the first embodiment is mainly described.

(Operation Example of Sequencer)

Figure 13:
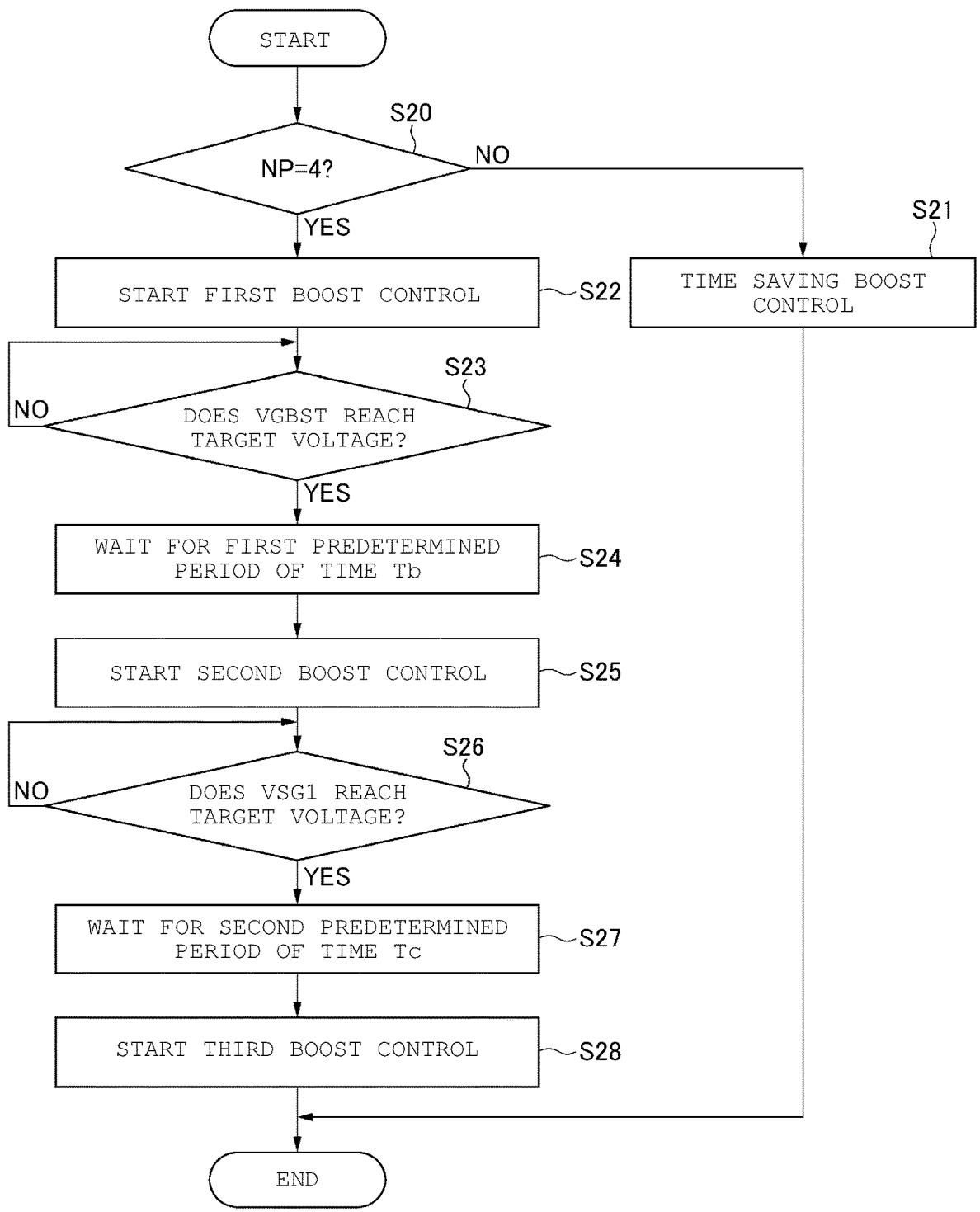
FIG. 13 is a flowchart illustrating a procedure of a process performed by a sequencer according to a second embodiment.

Instead of the control illustrated in FIG. 11, the voltage control unit 25B of the sequencer 25 according to the present embodiment performs the control illustrated in FIG. 13.

As illustrated in FIG. 13, the voltage control unit 25B determines whether the number of planes NP that perform the read operation is 4 (Step S20). According to the present embodiment, the number of "4" used in the process of Step S20 corresponds to a predetermined number. When the number of planes NP that perform the read operation is 3 or less, the voltage control unit 25B performs negative determination in the process of Step S20 (Step S20: NO) and performs time saving boost control (Step S21). The time saving boost control is control of increasing the voltages VGBST, VSG1, and VREAD by the same procedure as in the first embodiment.

When the number of planes NP that perform the read operation is 4, the voltage control unit 25B performs positive determination in the process of Step S20 (Step S20: YES), the voltages VGBST, VSG1, and VREAD are increased in the procedure illustrated in Steps S22 to S28. That is, first, the voltage control unit 25B starts the first boost control of increasing the voltage VGBST to 14 V on the voltage generation circuit 29E (Step S22) and then determines whether the voltage VGBST reaches 14 V (Step S23). When the voltage VGBST reaches 14 V (Step S23: YES), the voltage control unit 25B waits for a first predetermined period of time Tb (Step S24) and then starts the second boost control of increasing the voltage VSG1 to 10 V on the voltage generation circuit 29A (Step S25). Subsequently, the voltage control unit 25B determines whether the voltage VSG1 reaches 10 V (Step S26). When the voltage VSG1 reaches 10 V (Step S26: YES), the voltage control unit 25B waits for a second predetermined period of time Tc (Step S27), and then performs the third boost control of increasing the voltage VREAD to 9 V on the voltage generation circuit 29D (Step S28).

(Operation Example of Semiconductor Memory Device)

Subsequently, an operation example of the semiconductor memory device 2 according to the present embodiment is described.

When the number of planes NP that perform the read operation is 3 or less, the semiconductor memory device 2 according to the present embodiment is the same as the semiconductor memory device 2 according to the first embodiment in that the semiconductor memory device 2 according to the present embodiment operates as illustrated in FIGS. 12A and 12B. However, when the number of planes NP that perform the read operation is 4, the semiconductor memory device 2 according to the present embodiment operates as illustrated in FIGS. 14A and 14B.

Figures 14A, 14B:
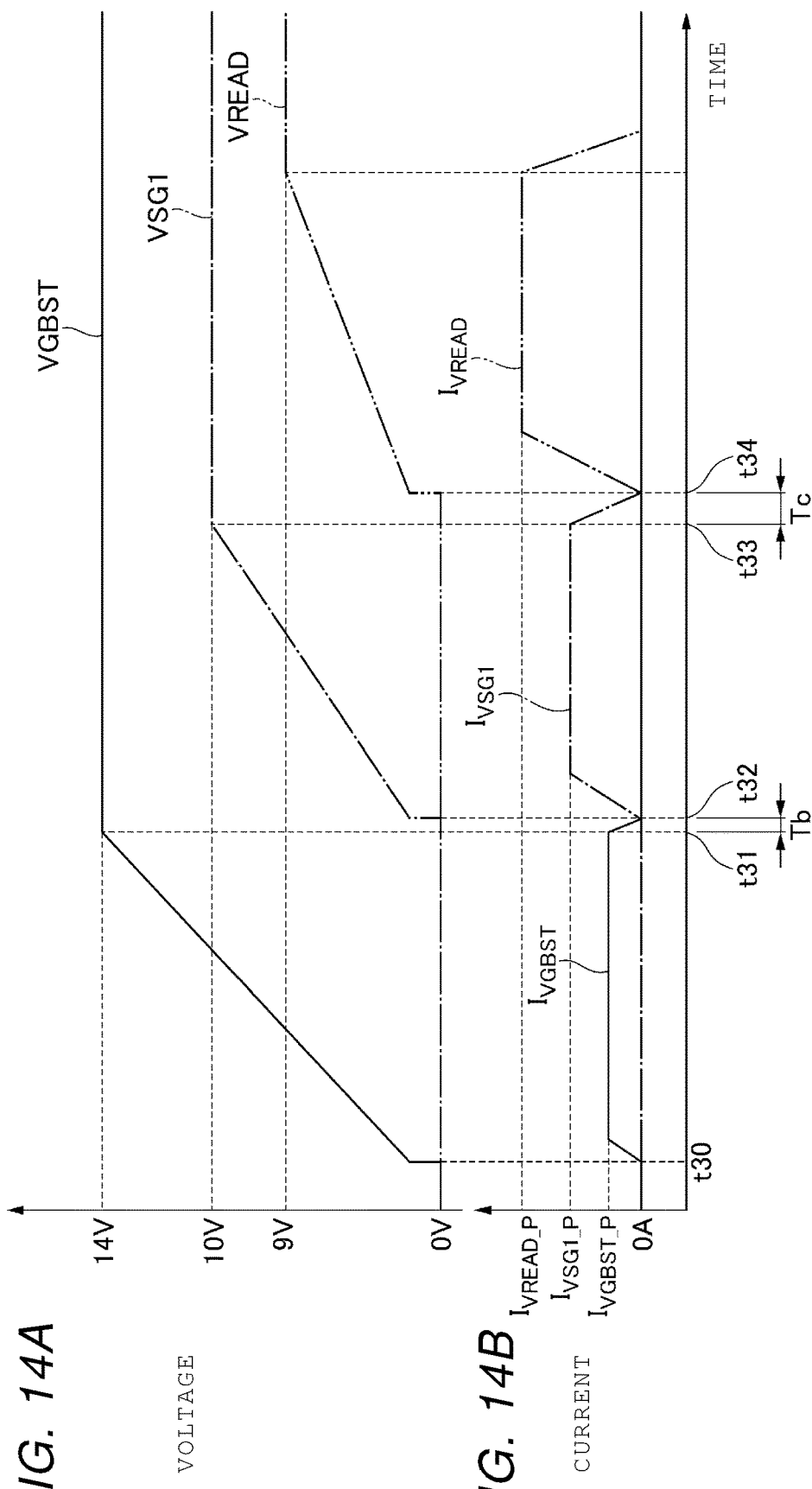
FIGS. 14A and 14B are timing charts illustrating transitions of a voltage and a current of some wirings during a read operation in a semiconductor memory device according to the second embodiment.

As illustrated in FIG. 14A, when the first boost control is started at time t30, the voltage VGBST starts to increase. Then, after the voltage VGBST reaches 14 V at time t31, the second boost control starts at the time of time t32 when the first predetermined period of time Tb elapses from time t31. Accordingly, after the time t32, the voltage VSG1 starts to increase. Subsequently, after the voltage VSG1 reaches 10 V at time t33, the third boost control starts at the time of time t34 when the second predetermined period of time Tc elapses from time t33. Accordingly, after the time t34, the voltage VREAD starts to increase.

In this manner, if the timings of increasing the voltages VGBST, VSG1, and VREAD are shifted, the periods of time when the currents $I_{VGBST}$, $I_{VSG1}$, and $I_{VREAD}$ reach the peak values can be shifted as illustrated in FIG. 14B. Therefore, the peak current $I_{cc\_P}$ is further reduced.

(Effect)

Among the four planes, when the number of planes NP that read data is four, the sequencer 25 starts the second boost control after the voltage VGBST reaches 14 V in the first boost control, performs the third boost control after the voltage VSG1 reaches 10 V in the second boost control, and increases the voltage VREAD to 9 V. According to this configuration, the peak current $I_{cc\_P}$ can be further reduced.

Other Embodiments

The present disclosure is not limited to the above examples.

For example, instead of the control of increasing the voltage VGBST in two stages as the first boost control, the semiconductor memory device 2 according to the first embodiment may perform the control of increasing the voltage VGBST in three or more stages.

In the semiconductor memory device 2 according to the second embodiment, the predetermined number set for the number of planes NP used in the process of Step S20 illustrated in FIG. 13 may be changed to any applicable value other than "3" according to the number of planes in the semiconductor memory device 2. For example, when five planes are provided in the semiconductor memory device 2, the predetermined number set for the number of planes NP in the process of Step S20 may be set to "5". That is, in this case, in the process of Step S20, it is determined whether the number of planes NP that perform the read operation is five.

In the process of Step S20 illustrated in FIG. 13, it may be determined whether the number of planes NP that perform the read operation is a predetermined determination number or more. In addition, for example, when four planes are provided in the semiconductor memory device 2, the determination number can be set to "3". The determination number can be set to any number smaller than the number of planes provided in the semiconductor memory device 2.

As the process of Step S12 illustrated in FIG. 11, for example, the voltage control unit 25B may perform a process of determining whether the voltage VREAD increases to a predetermined voltage, while monitoring the voltage VREAD. In this case, when it is determined that the voltage VREAD increases to a predetermined voltage (Step S12: YES), the voltage control unit 25B further increases the voltage VGBST from the intermediate voltage Vm to the target voltage of 14 V (Step S13).

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor memory device comprising:
a memory cell array including a select transistor and a memory cell transistor connected in series, a bit line connected to the select transistor, a select gate line connected to a gate of the select transistor, and a word line connected to a gate of the memory cell transistor;
a decoder circuit configured to switch between connection and disconnection states of each of the select gate line and the word line;
a voltage supply circuit configured to generate a first voltage supplied to the decoder circuit, a second voltage supplied to the select gate line, and a third voltage supplied to the word line; and
a control circuit configured to control the voltage supply circuit, wherein
the control circuit, during a read operation with respect to the memory cell transistor:
starts a first control operation on the voltage supply circuit to boost the first voltage to a first target voltage to cause the decoder circuit to connect the select gate line to the voltage supply circuit and to connect the word line to the voltage supply circuit;
during the first control operation, starts a second control operation on the voltage supply circuit to boost the second voltage to a second target voltage; and
during the second control operation, starts a third control operation on the voltage supply circuit to boost the third voltage to a third target voltage, wherein
during the first control operation, the first voltage is increased to an intermediate voltage lower than the first target voltage, maintained at the intermediate voltage for a period of time from a first timing to a second timing, and then further increased to the first target voltage, wherein at the first timing, i) the second voltage being less than the second target voltage and ii) the third voltage being less than the third target voltage, satisfy, and at the second timing, at least one of i) the second voltage being at the second target voltage and ii) the third voltage being at the third target voltage, satisfies.

2. The semiconductor memory device according to claim 1, wherein the control circuit carries out at least a part of the second control operation during the period of time.

3. The semiconductor memory device according to claim 2, wherein the control circuit carries out at least a part of the third control operation during the period of time.

4. The semiconductor memory device according to claim 2, wherein the second control operation ends during the period of time.

5. The semiconductor memory device according to claim 1, wherein the control circuit carries out at least a part of the third control operation during the period of time.

6. The semiconductor memory device according to claim 5, wherein the third control operation continues after the period of time.

7. The semiconductor memory device according to claim 1, wherein the first target voltage is higher than the second target voltage, and the second target voltage is higher than the third target voltage.

8. The semiconductor memory device according to claim 7, wherein the intermediate voltage is lower than the second target voltage and higher than the third target voltage.

9. The semiconductor memory device according to claim 1, wherein a maximum current that flows from the voltage supply circuit to the decoder circuit during the first control operation is less than a maximum current that flows from the voltage supply circuit to the select gate line during the second control operation.

10. The semiconductor memory device according to claim 9, wherein the maximum current that flows from the voltage supply circuit to the select gate line during the second control operation is less than a maximum current that flows from the voltage supply circuit to the word line during the third control operation.

11. The semiconductor memory device according to claim 1, wherein the second voltage supplied from the voltage supply circuit to the select gate line reaches the second target voltage on or before the second timing.

12. The semiconductor memory device according to claim 1, wherein the semiconductor memory device includes a plurality of planes, the memory cell array and the decoder circuit are included in one of the planes, and the control circuit is configured to determine a number of planes to be read, and perform the first, second, and third control operations when the determined number of planes to be read is less than a predetermined value.

13. The semiconductor memory device according to claim 12, wherein when the determined number of planes to be read is equal to or greater than the predetermined value, the control circuit, during the read operation with respect to the memory cell transistor:

starts a fourth control operation to cause the voltage supply circuit to boost the first voltage to the first target voltage;

after the fourth control operation ends, starts the second control operation; and after the second control operation ends, starts the third control operation.

14. The semiconductor memory device according to claim 13, wherein during the fourth control operation, the first voltage is continuously increased to the first target voltage.

15. The semiconductor memory device according to claim 1, wherein the voltage supply circuit includes a charge pump circuit, and the controller is further configured to cause the charge pump circuit to operate to increase the first voltage to the intermediate voltage, and then to the first target voltage, during the first control operation.

16. A voltage control method in a semiconductor memory device including:

a memory cell array including a select transistor and a memory cell transistor connected in series, a bit line connected to the select transistor, a select gate line connected to a gate of the select transistor, and a word line connected to a gate of the memory cell transistor;

a decoder circuit configured to switch between connection and disconnection states of each of the select gate line and the word line; and a voltage supply circuit configured to generate a first voltage supplied to the decoder circuit, a second voltage supplied to the select gate line, and a third voltage supplied to the word line, the method comprising, during a read operation with respect to the memory cell transistor:

starting a first control operation on the voltage supply circuit to boost the first voltage to a first target voltage to cause the decoder circuit to connect the select gate line to the voltage supply circuit and to connect the word line to the voltage supply circuit;

during the first control operation, starting a second control operation on the voltage supply circuit to boost the second voltage to a second target voltage; and during the second control operation, starting a third control operation on the voltage supply circuit to boost the third voltage to a third target voltage, wherein during the first control operation, the first voltage is increased to an intermediate voltage lower than the first target voltage, maintained at the intermediate voltage for a period of time from a first timing to a second timing, and then further increased to the first target voltage, wherein at the first timing, i) the second voltage being less than the second target voltage and ii) the third voltage being less than the third target voltage, satisfy, and at the second timing, at least one of i) the second voltage being at the second target voltage and ii) the third voltage being at the third target voltage, satisfies.

17. The voltage control method according to claim 16, wherein at least a part of the second control operation is carried out during the period of time.

18. The voltage control method according to claim 17, wherein at least a part of the third control operation is carried out during the period of time.

19. The voltage control method according to claim 17, wherein the second control operation ends during the period of time.

20. The voltage control method according to claim 16, wherein at least a part of the third control operation is carried out during the period of time.

* * * * *